United States Patent
Narajowski et al.

(10) Patent No.: US 9,826,649 B2
(45) Date of Patent: Nov. 21, 2017

(54) REMOVABLE DOOR FOR ELECTRONIC DEVICE

(71) Applicant: Apple Inc., Cupertino, CA (US)

(72) Inventors: David H. Narajowski, Los Gatos, CA (US); Euan S. Abraham, Sunnyvale, CA (US); Brett W. Degner, Menlo Park, CA (US); Daniel L. McBroom, Leonard, TX (US); Erik Shahoian, Sonoma, CA (US)

(73) Assignee: APPLE INC., Cupertino, CA (US)

( * ) Notice: Subject to any disclaimer, the term of this patent is extended or adjusted under 35 U.S.C. 154(b) by 242 days.

(21) Appl. No.: 13/631,700

(22) Filed: Sep. 28, 2012

(65) Prior Publication Data

US 2014/0091688 A1    Apr. 3, 2014

(51) Int. Cl.
| | |
|---|---|
| *A47B 81/00* | (2006.01) |
| *A47B 97/00* | (2006.01) |
| *H05K 5/02* | (2006.01) |
| *H05K 5/03* | (2006.01) |
| *G06F 1/16* | (2006.01) |
| *H05K 9/00* | (2006.01) |
| *G06F 1/18* | (2006.01) |

(52) U.S. Cl.
CPC .............. *H05K 5/02* (2013.01); *G06F 1/1601* (2013.01); *G06F 1/181* (2013.01); *H05K 5/0247* (2013.01); *H05K 5/03* (2013.01); *G06F 1/182* (2013.01); *H05K 9/0016* (2013.01)

(58) Field of Classification Search
CPC ............................. G06F 1/182; H05K 9/0016
USPC ............................. 312/223.2, 223.1, 265.6; 361/679.21–679.3, 679.55–679.56, 679.6, 361/679.33–679.39, 724–728; 292/80, 292/81, 87, 91, 95, 96, 116, 117, 120, 292/DIG. 11, 340, DIG. 63
See application file for complete search history.

(56) References Cited

U.S. PATENT DOCUMENTS

| | | | | |
|---|---|---|---|---|
| 4,106,839 | A | * | 8/1978 | Cooper ............ H01R 13/65802 439/607.18 |
| 4,989,622 | A | * | 2/1991 | Kozuka et al. ............... 132/301 |
| 5,055,347 | A | | 10/1991 | Bacon, Jr. |
| 6,061,104 | A | | 5/2000 | Evanicky et al. |

(Continued)

FOREIGN PATENT DOCUMENTS

WO    WO2015/153701    10/2015

*Primary Examiner* — Daniel J Troy
*Assistant Examiner* — Andres F Gallego
(74) *Attorney, Agent, or Firm* — Brownstein Hyatt Farber Schreck, LLP

(57) ABSTRACT

A removable door for an electronic device. The door may include a spring plate having a first second surface, and a plurality of springs attached to a perimeter of the spring plate. The plurality of springs may engage a portion of an enclosure of the electronic device to retain at least the spring plate within an access opening formed in the enclosure. The door may also include a door cap covering the access opening formed in the enclosure. The door cap may include an interior surface connected to the first surface of the spring plate, and an exterior surface forming a portion of an outer surface of the enclosure. Additionally, the door may include a cover connected to the second surface of the spring plate. The cover may face an interior of the enclosure and separated from the door cap by the spring plate.

19 Claims, 18 Drawing Sheets

(56) References Cited

U.S. PATENT DOCUMENTS

| | | | |
|---|---|---|---|
| 6,093,887 A * | 7/2000 | Ponto | H05K 9/0016 |
| | | | 174/377 |
| 6,189,938 B1 * | 2/2001 | Nakadaira et al. | 292/87 |
| 6,288,330 B1 * | 9/2001 | Chen | 174/382 |
| 6,359,768 B1 * | 3/2002 | Eversley | G06F 1/182 |
| | | | 361/212 |
| 6,392,873 B1 | 5/2002 | Honda | |
| 6,483,024 B1 * | 11/2002 | Smithson | H05K 9/0016 |
| | | | 174/354 |
| 6,589,891 B1 | 7/2003 | Rast | |
| 6,654,256 B2 * | 11/2003 | Gough | H05K 9/0016 |
| | | | 174/383 |
| 6,671,160 B2 * | 12/2003 | Hayden | H05F 3/02 |
| | | | 361/212 |
| 6,940,731 B2 * | 9/2005 | Davis | G06F 1/182 |
| | | | 174/377 |
| 7,048,242 B2 | 5/2006 | Oddsen, Jr. | |
| 7,491,900 B1 * | 2/2009 | Peets et al. | 174/383 |
| 7,986,525 B2 * | 7/2011 | Wang | 361/679.59 |
| 8,066,233 B2 | 11/2011 | Fujikawa et al. | |
| 9,162,519 B2 | 10/2015 | Suehiro et al. | |
| 2002/0130981 A1 | 9/2002 | Ma et al. | |
| 2007/0195495 A1 | 8/2007 | Kim et al. | |
| 2009/0059551 A1 * | 3/2009 | He | H05K 9/0018 |
| | | | 361/818 |
| 2014/0078682 A1 * | 3/2014 | Jenks | G11B 17/00 |
| | | | 361/727 |
| 2014/0084770 A1 * | 3/2014 | Tsai | G06F 1/181 |
| | | | 312/326 |

* cited by examiner

REMOVABLE DOOR FOR ELECTRONIC DEVICE

TECHNICAL FIELD

The present invention relates generally to a door for a electronic device that may be removed by the user.

BACKGROUND

Electronic devices, such as computers, computing devices and the like are equipped with various components such as memory devices, video cards, power supplies and so on. The various components of an electronic device are typically mounted in an enclosure that protects the components from damage and/or electrical interference when the electronic device is in use. In some instances, the various components of an electronic device may disposed in slots or other similar structures that allow the components to be easily added or removed. For example, some computing devices include slots through which memory sticks of various sizes and capacities may be added to the computing device. For at least the reason that certain users may wish to have access to the interior of a computing device enclosure for the purpose of adding or removing certain components, it would be advantageous to have a door for a computing other electronic device that is removable.

SUMMARY

In various embodiments, the present disclosure relates to a removable door for a computing device, comprising a spring plate; a plurality of springs attached to a perimeter of the spring plate, the plurality of springs adapted to engage a portion of an electronic device enclosure to at least retain the spring plate in place within an access opening of the electronic device enclosure; and a door cap connected at an interior surface of the door cap to a first surface of the spring plate, the door cap adapted to cover the access opening such that an exterior surface of the door cap forms a portion of an exterior surface of the electronic device enclosure when the spring plate is in place within the access opening.

In some embodiments, the plurality of springs provide an electromagnetic compatibility seal by forming an electrically conductive path between the electronic device enclosure and the spring plate.

In some embodiments, the plurality of springs provide an electromagnetic compatibility seal by forming an electrically conductive path between the electronic device enclosure and the door cap.

In some embodiments, the surface area of the door cap is greater than the surface area of the spring plate such that the door cap contains an overhang region located between a perimeter of the door cap and the perimeter of the spring plate.

In some embodiments, the overhang region of the door cap contacts a first engagement surface of a door seat when the spring plate is in place within the access opening, the door seat being connected to the electronic device enclosure and located within the access opening, recessed from the exterior surface of the electronic device enclosure.

In some embodiments, the plurality of springs compress against a second engagement surface of the door seat when the spring plate is in place within the access opening, the second engagement surface being substantially perpendicular to the first engagement surface; and the compression of the plurality of springs causes the plurality of springs to exert a force against the second engagement surface that retains the spring plate in place within the access opening.

In some embodiments, the door seat contains a groove in the first engagement surface proximate to a wall of the access opening such that the wall of the access opening and a wall of the groove form a continuous surface.

In some embodiments, the perimeter of the door cap includes a plurality of door caps edges; and the groove offsets the first engagement surface from the door cap edges such that the door cap edges do not contact the first engagement surface when the overhang region of the door cap contacts the first engagement surface.

In some embodiments, the door cap and the access opening are sized such that there is a spatial gap between the door cap and a wall of the access opening when the overhang region of the door cap contacts the first engagement surface of the door seat.

In some embodiments, the edges of the door cap are tapered such that the width of the spatial gap between the door cap and the wall of the access opening varies across a thickness of the door cap, the width of the spatial gap being minimal at the interior surface of the door cap, and the width of the spatial gap being maximal at the exterior surface door cap.

Some embodiments further comprise a cover connected to a second surface of the spring plate; and a plurality of spring seats connected to a perimeter of the cover, the plurality of spring seats being in contact with the plurality of springs connected to the perimeter of the spring plate.

In various embodiments, the present disclosure relates to an electronic device enclosure, comprising an enclosure wall; an opening in the enclosure wall that provides access to an interior space, the opening adapted to be covered by a removable door; a door seat connected to the enclosure wall and located within the opening in a recessed position relative to an exterior surface of the enclosure wall, the door seat having a door engagement surface that contacts a portion of the removable door when the removable door covers the opening; and a groove in the door engagement surface proximate to a wall of the opening such that the wall of the opening and a wall of the groove form a continuous surface.

In some embodiments, the removable door includes a plurality of door edges; and the groove offsets the door engagement surface from the door edges such that the door edges do not contact the door engagement surface when the removable door contacts the door engagement surface.

In some embodiments, the door engagement surface is a first door engagement surface, the door seat further comprising a second door engagement surface substantially perpendicular to the first door engagement surface, the second door engagement adapted to contact a plurality of springs on the removable door when the removable door covers the opening; wherein the plurality of springs compress against the second engagement surface to exert a force against the second door engagement surface to retain the removable door in place.

Some embodiments further comprise a lever arm pivotably mounted to an interior surface of enclosure wall, the lever arm oriented to impart a force to a lever engaging surface of the door seat through contact with a first end of the lever arm when a second end of the lever arm is actuated by a user; wherein the force imparted to the door seat by the first end of the lever arm dislodges the removable door from the door seat.

Some embodiments further comprise a pin hole extending through the enclosure wall; wherein the user actuates the second end of the lever arm by pressing on the second end of the lever arm with a pin hole tool inserted through the pin hole.

Some embodiments further comprise a pin hole extending through the enclosure wall; and a pin mounted on the second end of the lever arm, the pin disposed through the pin hole such that an end of the pin extends to an exterior of the enclosure; wherein the user actuates the second end of the lever arm by pressing on the end of the pin.

In various embodiments, the present disclosure relates to an electronic device enclosure, comprising an enclosure wall; an opening in the enclosure wall that provides access to an interior space, the opening adapted to be covered by a removable door; and a door seat connected to the enclosure wall and located within the opening in a recessed position relative to an exterior surface of the enclosure wall, the door seat comprising first and second door engagement surfaces; wherein the first door engagement surface contacts a portion of the removable door when the removable door covers the opening; the second door engagement surface is substantially perpendicular to the first door engagement surface, the second door engagement adapted to contact a plurality of springs on the removable door when the removable door covers the opening; and the plurality of springs compress against a second engagement surface to exert a force against the second door engagement surface to retain the removable door in place.

The electronic device enclosure of claim 18, wherein the removable door includes a plurality of door edges, the electronic device enclosure further comprising a groove in the first door engagement surface proximate to a wall of the opening such that the wall of the opening and a wall of the groove form a continuous surface, and the groove offsets the first door engagement surface from the door edges such that the door edges do not contact the first door engagement surface when the removable door contacts the first door engagement surface.

Some embodiments further comprise a lever arm pivotably mounted to an interior surface of enclosure wall, the lever arm oriented to impart a force to a lever engaging surface of the door seat through contact with a first end of the lever arm when a second end of the lever arm is actuated by a user through a pin hole that extends through the enclosure wall; wherein the force imparted to the door seat by the first end of the lever arm dislodges the removable door from the door seat.

In various embodiments, the present disclosure relates to an electronic device enclosure, comprising an enclosure wall; an opening in the enclosure wall that provides access to an interior space, the opening adapted to be covered by a removable door; a door seat connected to the enclosure wall and located within the opening in a recessed position relative to an exterior surface of the enclosure wall, the door seat having a door engagement surface that contacts a portion of the removable door when the removable door covers the opening; and a lever arm pivotably mounted to an interior surface of enclosure wall, the lever arm oriented to impart a force to a lever engaging surface of the door seat through contact with a first end of the lever arm when a second end of the lever arm is actuated by a user through a pin hole that extends through the enclosure wall, wherein the force imparted to the door seat by the first end of the lever arm dislodges the removable door from the door seat.

Some embodiments further comprise a power port disposed on the enclosure wall; wherein the pin hole that extends through the enclosure wall is located within the power port.

Some embodiments further comprise a power port cap that is removed from the power to expose the pin hole.

In some embodiments, the user actuates the second end of the lever arm by pressing on the second end of the lever arm with a pin hole tool inserted through the pin hole.

Some embodiments further comprise a pin mounted on the second end of the lever arm, the pin disposed through the pin hole such that an end of the pin extends to an exterior of the enclosure, wherein the user actuates the second end of the lever arm by pressing on the end of the pin.

In various embodiments, the present disclosure relates to a removable door for a computing device, comprising an electrically conductive compressible gasket adapted to engage a portion of an electronic device enclosure to at least retain gasket in place within an access opening of the electronic device enclosure; and a door cap connected at an interior surface of the door cap to the gasket, the door cap adapted to cover the access opening such that an exterior surface of the door cap forms a portion of an exterior surface of the electronic device enclosure when the gasket is in place within the access opening; wherein the gasket provides an electromagnetic compatibility seal by forming an electrically conductive path to the electronic device enclosure such that transmission of electromagnetic radiation into and out of the electronic device enclosure is substantially inhibited.

SPECIFICATION

Figure 1:
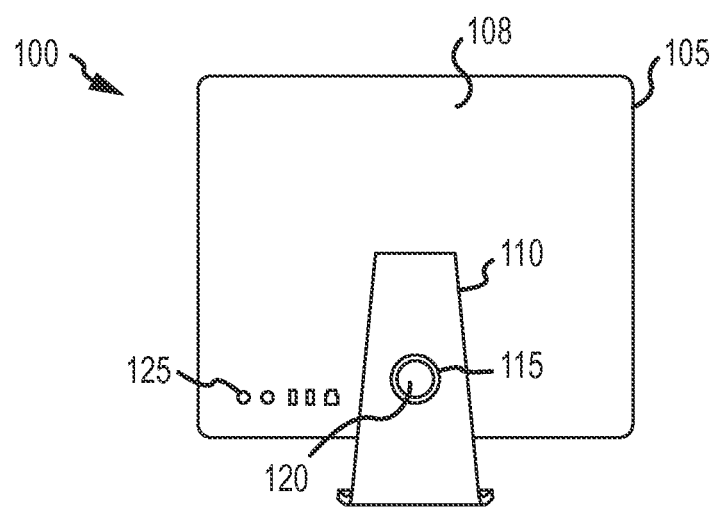
FIG. 1 is a schematic illustration of a computing system enclosure that includes an enclosure wall having a removable stand and a removable door in accordance with embodiments discussed herein.
Figure 2:
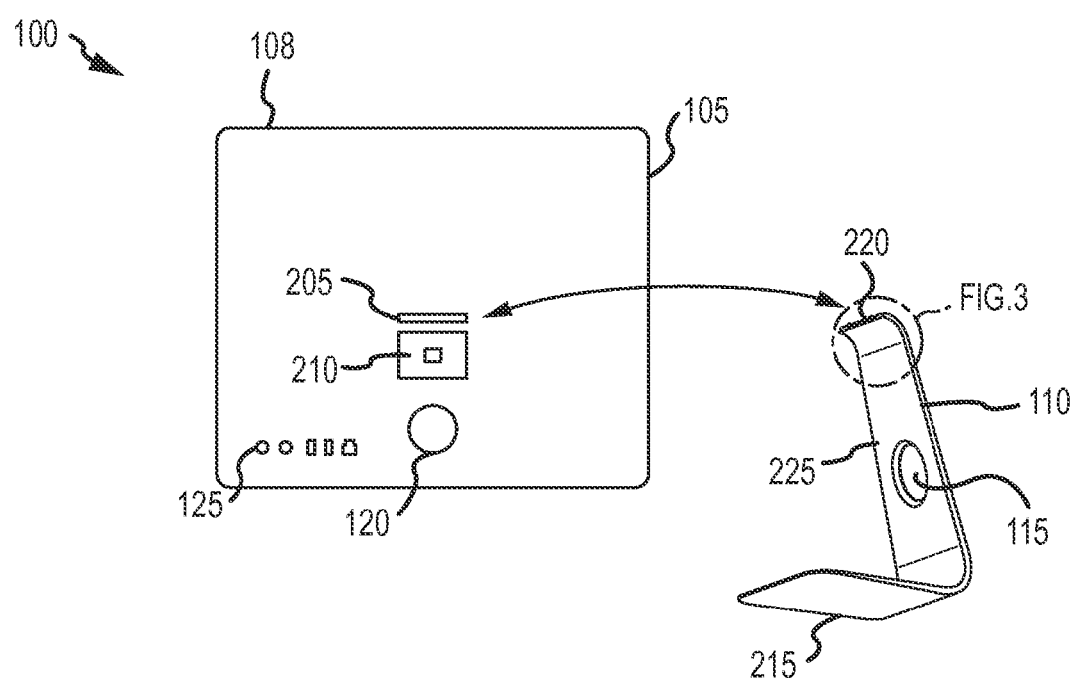
FIG. 2 is a schematic illustration of the computing system of FIG. 1 with the stand removed from the enclosure wall.

FIG. 1 is a schematic illustration showing components and features in accordance with embodiments discussed herein. FIG. 1 shows a computing system enclosure 100, as an example of an electronic device enclosure. The example computing system enclosure 100 includes a removable stand and a removable door. The removable stand is generally indicated by reference numeral 110. The removable door is not visible in FIG. 1, as it is obscured from view by the removable stand 110. The removable door is visible in FIG. 2, which is a schematic illustration of the computing system enclosure 100 with the stand 110 removed from the enclosure wall 105. As can be seen in FIG. 2, the removable door is generally indicated by reference numeral 210. The enclosure 100 may at least partially surround a variety of computing device elements, such as one or more processing units, memory modules, storage devices, input/output ports, and so on. A display may be at least partially enclosed by the enclosure 100, and may likewise, with the enclosure, serve to surround (or partially surround) such computing elements. In one embodiment, the display may be visible from the front of the device (e.g., the side opposite that shown in FIG. 1).

As shown in FIG. 1, the removable stand 110 may be connected to the enclosure wall 105. The enclosure 100 shown in FIG. 1 is oriented such that that a rear enclosure wall 105 is visible. In one embodiment, the enclosure 100 includes a display surface on the opposite side from that of the rear enclosure wall 105. Although not visible in FIG. 1, the display surface may be a screen or other surface capable of displaying images to a viewer. The display surface may be implemented as a plasma display, a light-emitting diode (LED) display, a liquid crystal display (LCD), an organic light-emitting diode display (OLED), or as any other technology that is capable of displaying images to a user.

In one embodiment, the enclosure 100 may contain a computing system that is integrated within same structure as the display surface. Here, the enclosure 100 contains an "all-in-one" computing system that includes a central processing unit (CPU), memory, and other associated components in the same structure as that of the display surface that provides output to a user in the form of visual images. It should be appreciated that the enclosure 100 is not limited to embodiments that contain an "all-in-one" computing device. In various embodiments, the enclosure 100 may be implemented as part of a monitor that connects, through a cable or cord, to other computing components that are located in a separate structure.

As shown in FIG. 1, the enclosure wall 105 may additionally include data ports 125 disposed on a portion of the exterior surface 108. In one example, the data ports are located in a bottom corner of the exterior surface 108 of the enclosure wall 105. The data ports 125 may be used to connect various data lines that enable communication with devices or components that are internal to the enclosure wall 105. In embodiments where the enclosure wall 105 contains an "all in one" computer system, the data ports may provide connections between the "all in one" computer and various peripheral components. In embodiments where the enclosure 100 is part of a display surface without an integrated computer system, the data ports 125 may provide one or more video import ports that receive video input signals containing video to be output through the display screen.

FIG. 2 is a schematic illustration of the computing system enclosure 100 with the stand 110 disconnected form the enclosure wall 105. With the stand 110 removed, certain features of the stand 100 can be seen in greater detail. As shown in FIG. 2, the stand 110 may include a base 215 portion that is connected to an arm 225 portion. The base 215 is adapted to sit on a flat surface to provide a stable footing from which the weight of the enclosure wall 105 may be supported. The base 215 connects to the arm 225, which extends upwardly to support the weight of the enclosure 100 and component contained therein. In one embodiment, the base 215 may have a tapered shape along the later edges such that the base 215 is thinner in those portions of the base 215 that are more distant from the position of the user. The stand 110 may designed such that the center of gravity of the enclosure 100 is over or near the midpoint of the base 215, such that the base 215 can support the enclosure when the stand 110 is connected.

In addition to supporting the weight of the enclosure 100, the arm 225 may allow for access to a power port located on the exterior surface 108 of the enclosure wall 105. In one embodiment such as is illustrated in FIG. 1 and FIG.2, the power port 120 is located on the exterior surface 108 of the enclosure wall 105, directly adjacent from the stand 110. The power port 120 can be seen in greater detail in FIG. 2, as here the stand 110 is removed from the enclosure wall 105. As shown in FIG. 2, the power port 120 may be implemented as a circular opening in the exterior surface 108. It should be appreciated that the power port 120 is not limited to a circular opening, but that the power port 120 may be implemented as any shape that is appropriate to accommodate the end of power cord used in a particular design. As shown in FIG. 1 and FIG. 2, the arm 225 portion of the stand 110 may include a through-hole 115 that provides access to the power port 120. Specifically, with the stand 110 connected to the enclosure wall 105 as shown in FIG. 1, a power cable or other power cord may be threaded through the through-hole 115 and connected from there to the power port 120.

The arm 225 connects to the connector 220 portion of the stand 110. The connector 220 extends inwardly from the arm 225 to provide a connection mechanism that acts to attach the stand 110 to the enclosure wall 105. The connector 220 is adapted to be inserted through a slot 205 in the enclosure wall 105. The slot 205 can be seen in greater detail in FIG. 2, as here the stand 110 is removed from the enclosure wall 105. Likewise, the slot is shown in FIGS. 4 in and 5. The slot 205 provides access to an internal attachment member that is disposed and mounted proximate to an interior surface of the enclosure wall 105. The connector 220 is shown in greater detail in FIG. 3, and generally attaches or connects to the aforesaid attachment member. The attachment member to which the connector 220 connects is shown in greater detail in FIGS. 4 and 5.

Figure 3:
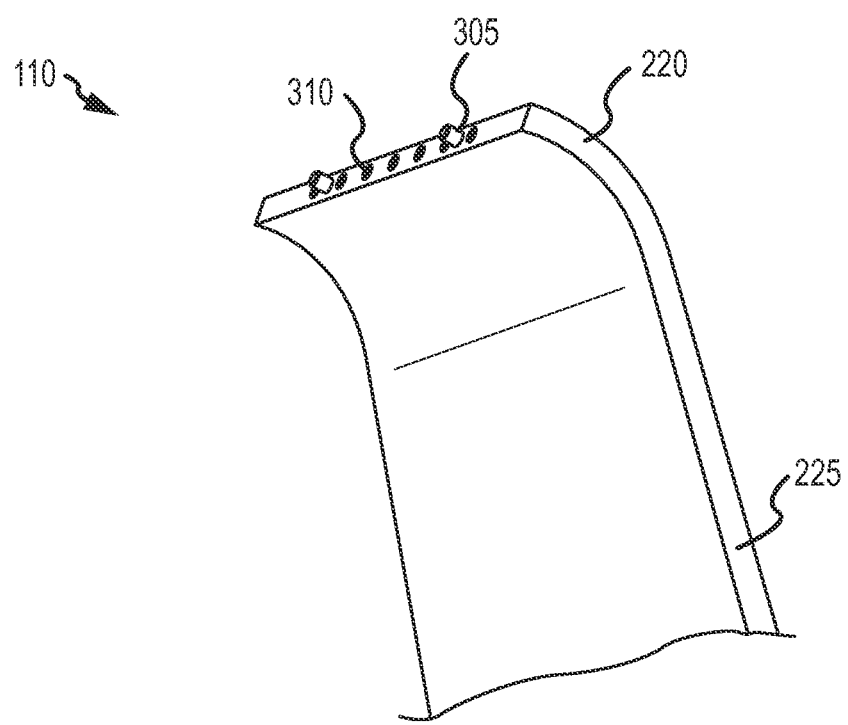
FIG. 3 is an enlarged view of a connector portion of the stand shown in FIG. 2.
Figure 4:
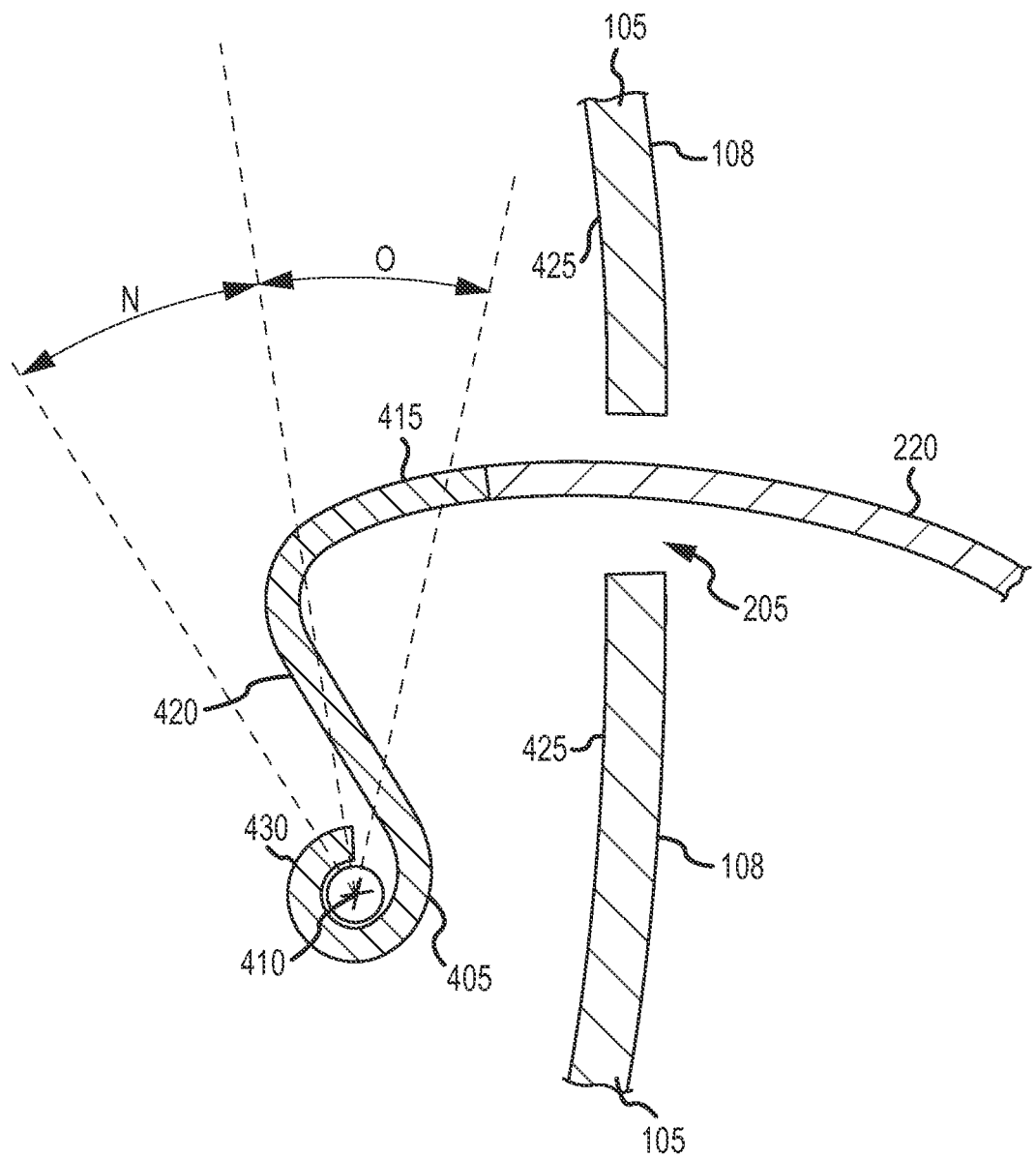
FIG. 4 is a schematic cross-sectional view of an internal attachment member embodiment that connects to the connector shown in FIG. 3.

FIG. 3 is an enlarged view of the connector 220 portion of the stand 110. As shown in FIG. 3, the connector 220 extends outwardly from the arm 225 portion of the stand 210. The end of the connector 220 includes a number of connector pins 305. The connector pins 305 are adapted to be received within connector pin holes associated with or disposed on the internal attachment member that is disposed and mounted proximate to an interior surface of the enclosure wall 105. The connector 220 additionally includes a number of connector pin holes 310 that are adapted to receive connector pins mounted on the internal attachment member. [[In one embodiment, the connector 220 incorporates friction fit pins. In other embodiments, the connector 220 may be implemented with detents that have pins or other elements that are adapted to be received in grooves. Additionally, O-rings, notches, or other appropriate components may be used in the connector 220.

FIG. 4 is a schematic cross-sectional view of an internal attachment member 405 in accordance with embodiments discussed herein. As shown in FIG. 4, the attachment member 405 is mounted on or proximate to the interior surface 425 of the enclosure wall 105 such that the attachment member 405 is within the interior of the enclosure 100. In accordance with embodiments discussed herein, the attachment member 405 is connected to a pivot point 410. The attachment member 405 includes an attachment member end 415 that is adapted to connect to the connector 220. The attachment member end 415 includes a number of pins which are configured to be received by the connector pin holes 310 associated with the connector 220. Similarly, the attachment member end 415 includes a number of connector pin holes adapted to receive the connector pins 305 associated with the connector 220.

The attachment member 405 is adapted to rotate or pivot around the pivot point 410 through both a normal range of motion and through an over-travel region. The normal range of motion is indicated in FIG. 4 by arc segment N. The attachment member 405 is configured to move through the normal range of motion N while the attachment member 405 is connected to the connector 220. When the attachment member 405 moves through the normal range of motion N, the connector 220 moves, to a certain degree, in and out of the slot 205. This enables the stand 110 to move into various angular positions with respect to the exterior surface 108 of the enclosure wall 105.

Figure 5:
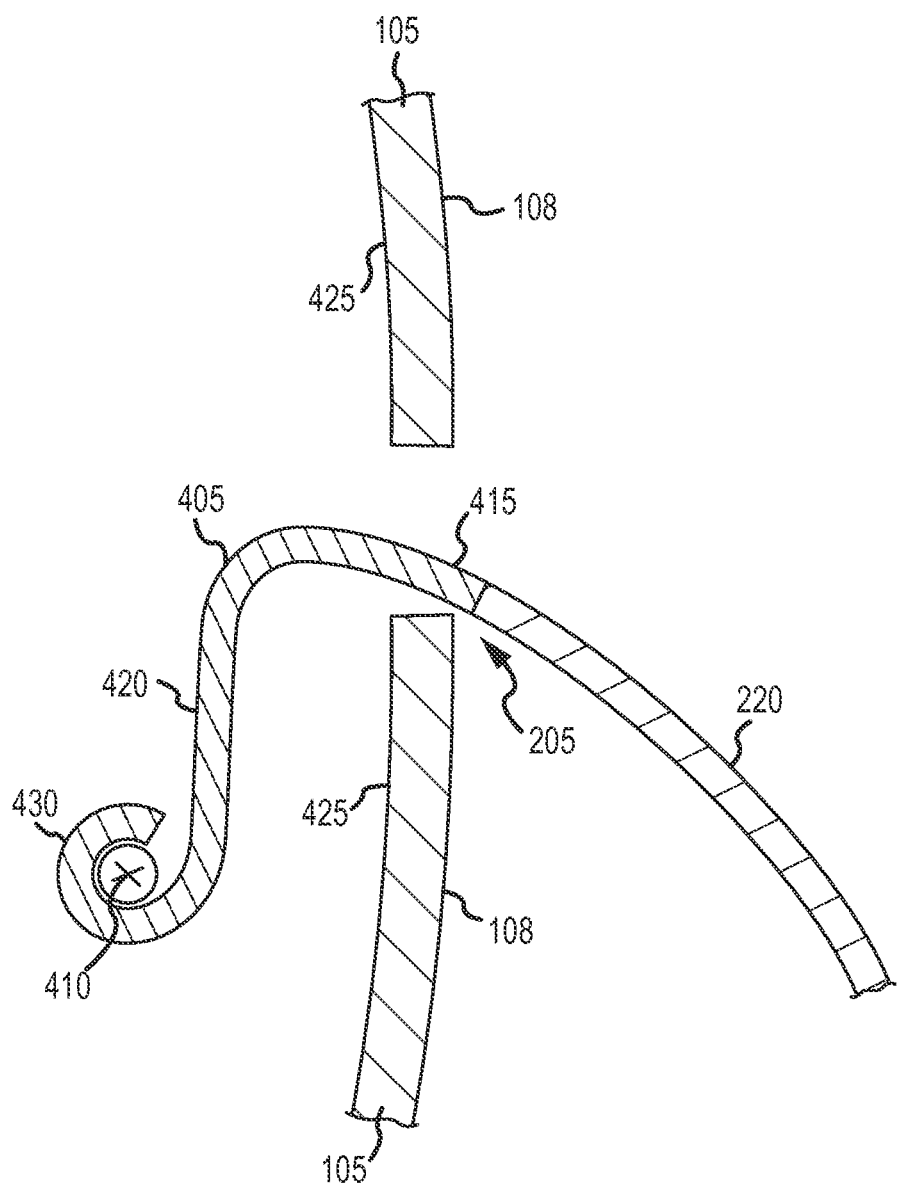
FIG. 5 is an illustration of the attachment member of FIG. 4 rotated through an over-travel region into its terminal position.

The over-travel region of the attachment member 405 is indicated in FIG. 4 by arc segment O. Movement of the attachment member 405 through the over-travel region O is enabled by an action on part of the user which allows both the connector 220 and the attachment member 405 to rotate out of the slot 205. FIG. 5 is an illustration of the attachment member 405 rotated through the over-travel region O into its terminal position. As can be seen in FIG. 5, a portion of the attachment member 405, including the attachment member end 415, will protrude through the slot 205 such that the attachment member end 415 extends to a certain degree beyond the exterior surface 108 of the enclosure wall 105. Once the attachment member 415 protrudes through the slot 205, the connector 220, and thus the stand 110, may be disconnected from the attachment member 405. In one embodiment, this includes a sideways movement of the connector 220 such that the connector pins 305 release from the attachment member end 415 and the connector pins associated with the attachment member end 415 release from the connector pin holes 310 associated with the connector 220. The relative arcs or distances of both the normal travel region N and the over travel region O may vary with embodiment, as may the ratio of the two travel regions.

Figure 6A:
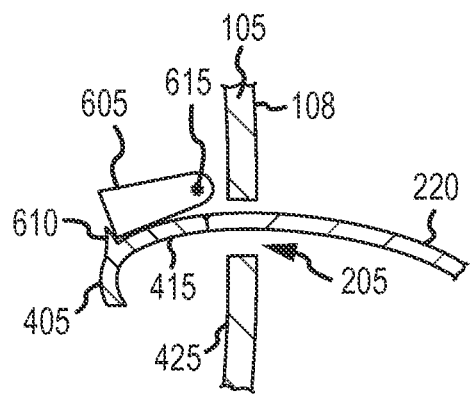
FIG. 6A is enlarged schematic illustration of a connection between the connector of FIG. 3 and the attachment member of FIG. 4, in accordance with embodiment discussed herein.
Figure 6B:
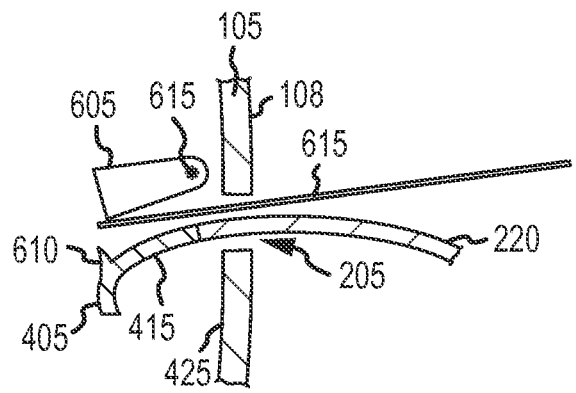
FIG. 6B illustrates an action on the part of the user that releases the stop shown in FIG. 6A, in accordance with embodiment discussed herein.
Figure 6C:
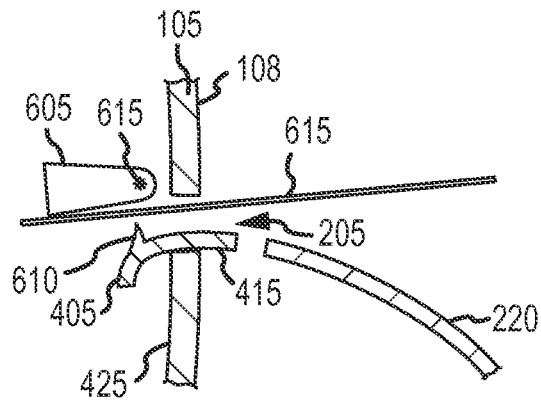
FIG. 6C is an illustration of detachment between the connector and the attachment member shown in FIG. 6A, in accordance with embodiment discussed herein.

As mentioned above, movement of the attachment member 405 through the over-travel region O is enabled by an action on part of the user which allows both the connector 220 and the attachment member 405 to rotate out of the slot 205. In one embodiment, this movement of the attachment member 405 is enabled by the user releasing a mechanical stop which, in its normal orientation, prevents the attachment member 405 from moving into the over-travel region O. FIGS. 6A-6C illustrate one embodiment of this mechanical release. FIGS. 6A-6C are enlarged schematic illustrations of the slot 205 having the connector 220 portion of the stand 110 disposed there-through. As further shown FIGS. 6A-6C, the connector 220 is attached to the attachment member end 415 of the attachment member 405. As shown in FIGS. 6A-6C, the mechanical release of the attachment member 405 may accomplished with the action of a rotatable stop 605.

In one embodiment, such as the one illustrated in FIGS. 6A-6C, the rotatable stop 605 may be attached or mounted to a pivot point 615 which is located proximately to the interior surface 425 of the enclosure wall 105. The stop 605 is adapted to rest on a top surface of the attachment member end 415 such that movement of the attachment member 405 into the over-travel region O is prevented by a catch 610. Specifically, the catch 610 is adapted to come into contact with an engagement surface of the stop 605 before the attachment member 405 rotates into the over-travel region. With the catch 610 in contact with the engagement surface of the stop 605, the attachment member 405 is at one end of its normal range of motion N and prevented from entering into the over-travel region O.

FIG. 6B illustrates an action on the part of the user that releases the stop 605. As shown in FIG. 6B, the user may release the stop 605 by inserting a stop release tool 615 through the slot 205. In one embodiment, the user may use a credit card, a driver's license, or other flat object as the stop release tool 615. As shown in FIG. 6B, the user inserts the stop release tool 615 through the slot 205 causing the stop 605 to move away from the top surface of the attachment member 405. With the stop 605 rotated in an upward direction, away from the top surface of the attachment member end 415, the attachment member 405 is able to rotate around the pivot point 410 without the catch 610 coming into contact with the engagement surface of the stop 605.

As shown in FIG. 6C, with stop 605 moved away from the top surface of the attachment member end 415 by the stop release tool 615, the attachment member 405 is able to move into the over-travel region O. In the over-travel region O, the attachment member end 415 is able to extend outwardly through the slot 205. In this position, the connector 220 may be disconnected from the attachment member end 415. As described above, in one embodiment, the connector 220 may be disconnected from the attachment member end 415 by a sideways movement of the connector 220 such that the connector pins 305 release from the attachment member end 415 and the connector pins associated with the attachment member end 415 release from the connector pin holes 310 associated with the connector 220.

In accordance with embodiments discussed herein, the attachment member 405 may be formed out of a single piece of sheet metal. The single piece of sheet metal may be shaped to form a first end 430, an arm 420 integrally formed with the first end 430, and a second end 415 integrally formed with the arm 420. As shown in FIG. 4, the first end 430 may be adapted to attach to a pivot 410, the arm may extend from the first end 430 to the second end 415, and the second end may be adapted to attach to a connector 220 portion of a stand 110. The attachment member 405 may also be embossed with a second metal in order to further strengthen the attachment member 405 and enhance its performance.

By constructing the attachment member 405 out of a single piece of sheet metal, the attachment member 405 is able to maintain a thin profile. Here, the attachment member 405 may be mounted in a thin region proximate to the interior surface 425 of the enclosure wall 105. Additionally, the thickness of the attachment member end 415 may be reduced such that the size of the slot 205 may be reduced.

Figure 7:
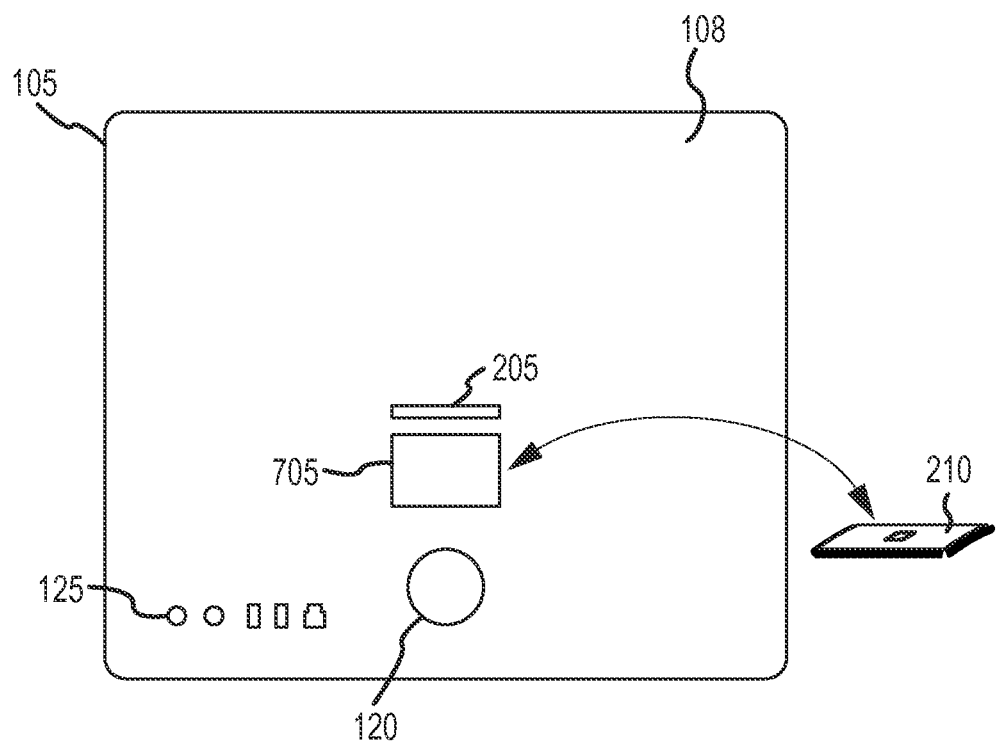
FIG. 7 is a schematic illustration of the computing system enclosure of FIG. 2 with the door removed from the enclosure wall.

Referring again to FIG. 2, the exterior surface 108 of enclosure wall 105 may include a removable door 210 that is directly adjacent to the stand 110. As shown in FIG. 2, the door 210 is visible once the stand 110 is removed or disconnected from the exterior surface 108 of the display panel 105. Referring now to FIG. 7, an access opening 705 may be exposed once the user removes the door 210 from the exterior surface 108 of the enclosure wall 105. In some embodiments, the access opening 705 is configured to allow a user to access one or more memory slots that are located beneath the door 210. Accordingly, the user may remove the door 210 and add or remove one or more memory sticks or other types of memory devices from the memory slots located beneath the door 210. By adding one or more memory sticks, the user may increase the memory capacity of the computing system enclosure 100. It should be appreciated that the removable door 210 as used to provide access for adding memory sticks is described herein by way of example and not limitation. Various embodiments of the door 210 may be implemented in order to provide a removable component that allows access to other components of the computing system enclosure 100, such as the power supply, video card, and so on. In certain embodiments, the door 210 may be a complex curve, with curvature along two axes.

Figure 8:
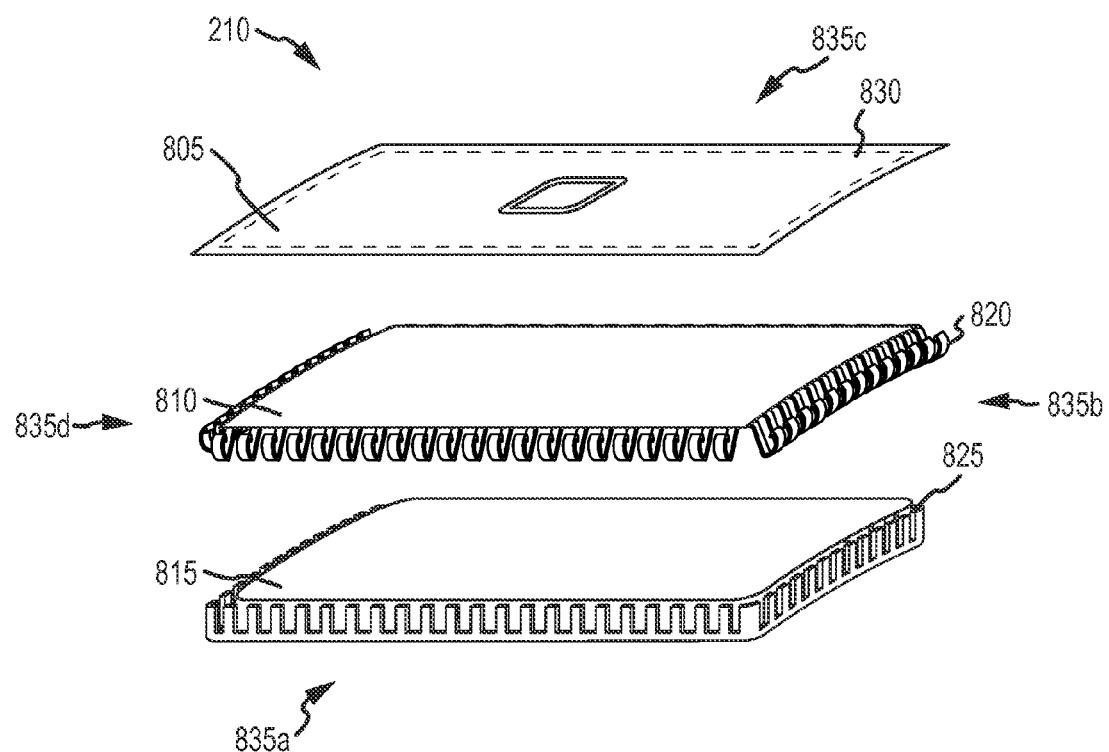
FIG. 8 is an exploded view of the removable door embodiment shown in FIG. 7, including a door cap, a spring plate, and a cover in accordance with embodiments discussed herein.

FIG. 8 is an exploded view of the removable door 210. As shown in FIG. 8, the door 210 includes a spring plate 810 on which are mounted a number of metal springs 820. The springs 820 may be mounted along the perimeter of the spring plate 810. In one respect, the springs 820 operate to retain the door 210 in place when the door 210 is connected to the exterior surface 108 of the enclosure wall 105. Specifically, the springs 820 compress and, in so doing, act against both the door 210 and a exterior surface 108 component to retain the door 210 in place. In another respect, the springs 820 operate to mitigate electromagnetic interference (EMI). Specially, the springs provide an electromagnetic compatibility (EMC) seal by making an electrical connection between door 210 and the exterior surface 108 of the enclosure wall 105. The retention and EMI functions of the springs are explained in greater detail below.

As further shown in FIG. 8, the spring plate 810 may be connected at a first surface of the spring plate 810 to a door cap 805. As shown in FIG. 8, the surface area of the door cap 805 may be slightly larger than the surface area of the spring plate 810 such that the edges of the door cap 805 extend beyond the edges of the spring plate 810. This aspect of the door cap is illustrated in FIG. 8 by reference numeral 830, which generally indicates an overhang region of the door cap 805. As shown in FIG. 8, the overhang region 830 is present on all four sides 835*a-d* of the door 210 and is located between a perimeter of the door cap and the perimeter of the spring plate. By way of illustration and not limitation, the door example door 210 show in FIG. 8 includes adjacent length sides 835*a* and 835*c* and adjacent width sides 835*b* and 835*d*. Here, the length sides 835*a* and 835*c* are shown as being longer than the width sides 835*b* and 835*d* although there is no particular requirement for this configuration. In other embodiments consistent with this disclosure, the length sides 835*a* and 835*c*, and the width sides 835*b* and 835*d* may be of any length or relative length that is appropriate for a given design.

As further shown in FIG. 8, the spring plate 810 may also be connected at a second surface of the spring plate 810 to a cover 815. The cover 815 includes a number of spring seats 825 attached to the perimeter of the cover 815. In accordance with embodiments discussed herein, each individual spring seat 825 engages an individual spring 820 in the spring plate 810 when the door 210 is assembled. Each individual spring seat 825 provides a backing or other type of engagement against which the individual spring 820 may sit against and be supported by when door 210 is assembled. The spring seats 825 also protect the springs 820 from damage when the door 210 is detached from the enclosure wall 105.

Figure 9A:
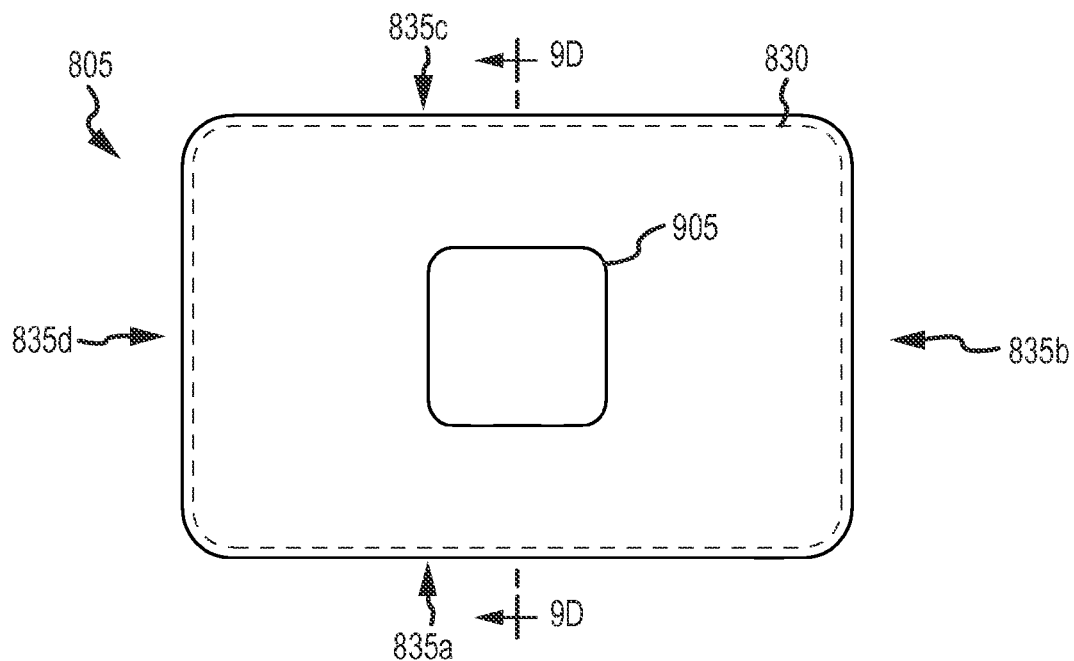
FIG. 9A is a top plan view of the door cap shown in FIG. 8.

The door cap 805 is illustrated in greater detail in FIGS. 9A-9E. FIG. 9A is a top plan view of the door cap 805. As shown in FIG. 9A, the door cap 805 includes a central region 905. In accordance with embodiments discussed herein, the central region 905 is free of anodization. The overhang region 830 is also illustrated in FIG. 9A.

Figure 9B:
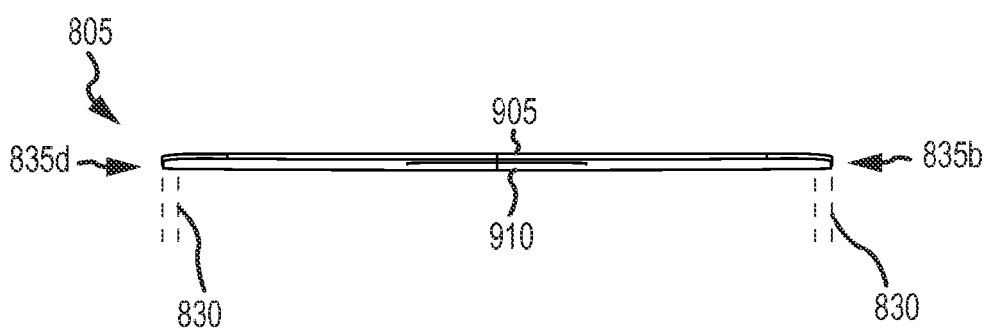
FIG. 9B is a front elevation view of the door cap shown in FIG. 8.

FIG. 9B is a front elevation view of the door cap 805. As can be seen in FIG. 9B, the door cap 805 includes an exterior surface 905 and an interior surface 910. The exterior surface 905 faces outwardly from the enclosure 100 when the door 210 is attached to the enclosure wall 105. In this position, the exterior surface 905 of the door cap 805 forms a portion of the exterior surface 108 of the enclosure 100. The interior surface 910 of the door cap 805 faces inwardly into the enclosure 100 when the door 210 is attached to the enclosure wall 105. The interior surface 910 of the door cap 805 attaches to a first surface of the spring plate 810 as show in FIG. 8. FIG. 9B also shows portions of the overhang region 830 that are disposed on side 835b and on side 835d of the door 210.

Figure 9C:
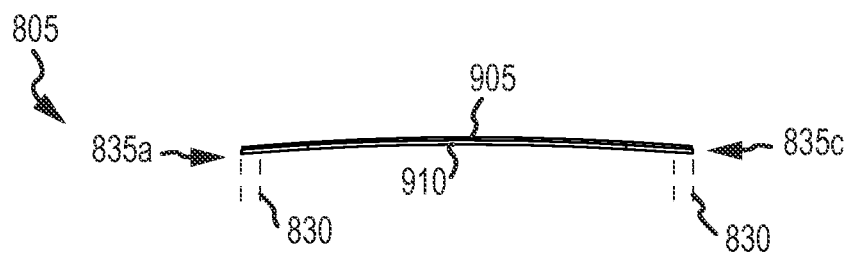
FIG. 9C is a side elevation view of the door cap shown in FIG. 8.

FIG. 9C is a side elevation view of the door cap 805. Portions of the overhang region 830 that are disposed on side 835a and on side 835c of the door 210 can be seen in FIG. 9C.

Figure 9D:
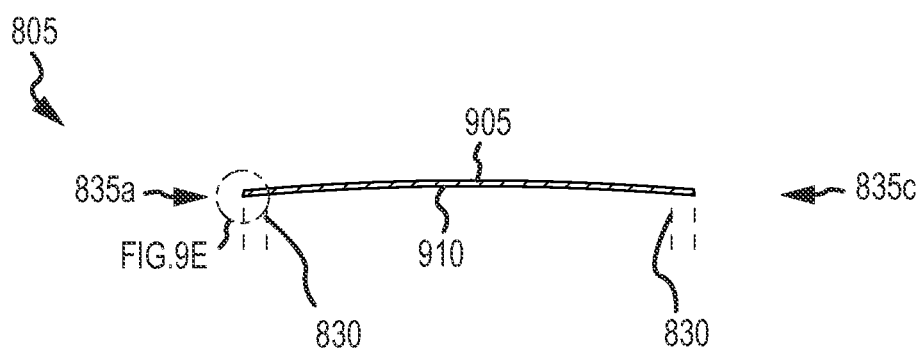
FIG. 9D is a side elevation cross-sectional view of the door cap shown in FIG. 8.

FIG. 9D is a side elevation cross-sectional view of the door cap 805. FIG. 9D shows a cross section of the door cap 805 that corresponds to the reference line 9D shown in FIG. 9A. Portions of the overhang region 830 that are disposed on side 835a and on side 835c of the door 210 can be seen in FIG. 9D. FIG. 9D additionally includes a reference circle B which is shown in greater detail in FIG. 9E.

Figure 9E:
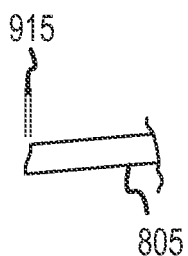
FIG. 9E is a close-up view of an end of the door cap shown in FIG. 8.
Figure 10A:
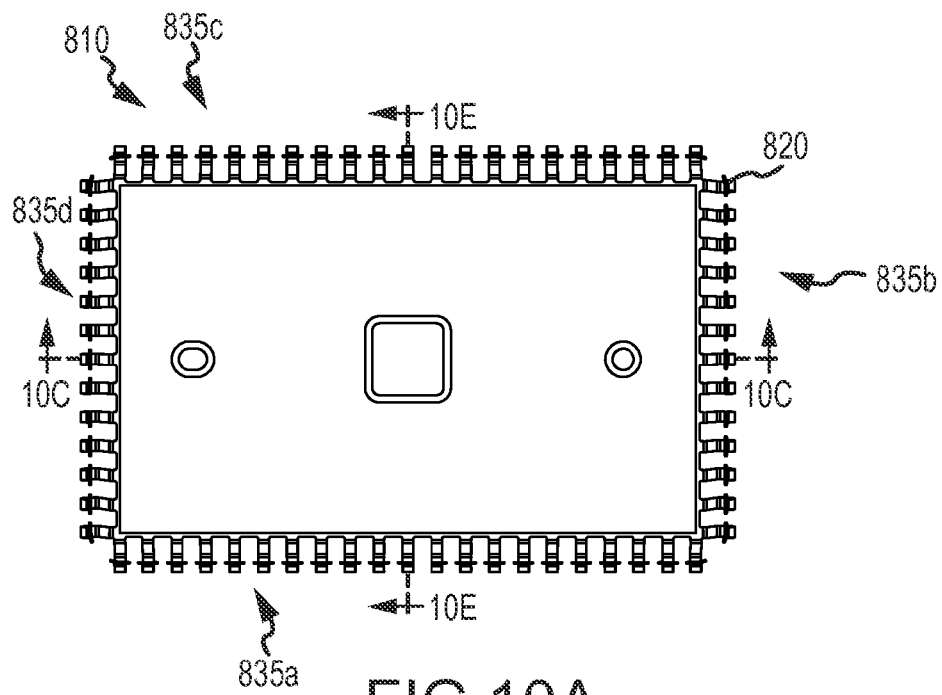
FIG. 10A is a top plan view of the spring plate shown in FIG. 8.

FIG. 9E is a close-up view of an end of the door cap 805. The end of the door cap 805 shown in FIG. 9E corresponds to reference circle B shown in FIG. 9D. As can be seen in FIG. 9E, the door cap 805 may include a tapered end. In accordance with other embodiments, door cap 805 may other end shapes such as stepped or angled The spring plate 810 is shown in greater detail in FIGS. 10A-10F. FIG. 10A is a top plan view of the spring plate 810. As shown in FIG. 10A, the spring plate 810 includes a number of springs 820 attached along the perimeter of the spring plate 810.

Figure 10B:
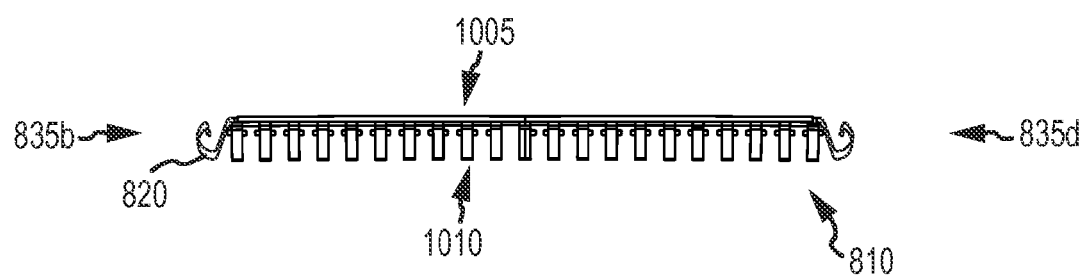
FIG. 10B is a front elevation view of the spring plate shown in FIG. 8.

FIG. 10B is a front elevation view of the spring plate 810. FIG. 10B shows a number springs 820 that are connected to the spring plate 810. The springs 820 shown in FIG. 10B are those that are attached to the perimeter of the spring plate 810 along the side 835a of the door 210. As can also be seen in FIG. 10B, the spring plate 810 includes a first surface 1005 and an second surface 1010. The first surface 1005 of the spring plate 810 attaches to the interior surface 910 of the door cap 805 as show in FIG. 8. The second surface 1010 of the spring plate 810 attaches to a first surface of the cover 815 as show in FIG. 8.

Figure 10C:
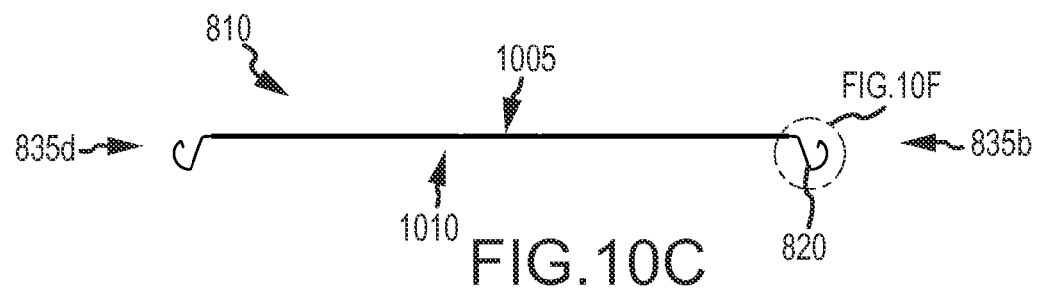
FIG. 10C is a cross-sectional front elevation view of the spring plate shown in FIG. 8.

FIG. 10C is a cross-sectional front elevation view of the spring plate 810. FIG. 10C shows a cross section of the spring plate 810 that corresponds to the reference line 10C shown in FIG. 10A. FIG. 10C shows two springs 820 that are connected to the spring plate 810. The two springs 820 shown in FIG. 10C are those that fall along the reference line 10C shown in FIG. 10A. Specifically, FIG. 10C shows one spring 820 connected the spring plate 810 on the side 835b of the door 210, and another spring 825 connected to the spring plate 810 on side 835d of the door 210. FIG. 10C additionally includes a reference circle C which is shown in greater detail in FIG. 10F.

Figure 10D:
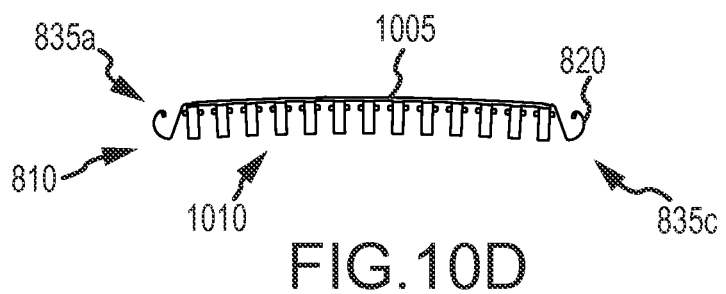
FIG. 10D is a side elevation view of the spring plate shown in FIG. 8.

FIG. 10D is a side elevation view of the spring plate 810. FIG. 10D shows a number springs 820 that are connected to the spring plate 810. The springs 820 shown in FIG. 10D are those that are attached to the perimeter of the cover 815 along the side 835b of the door 210.

Figure 10E:
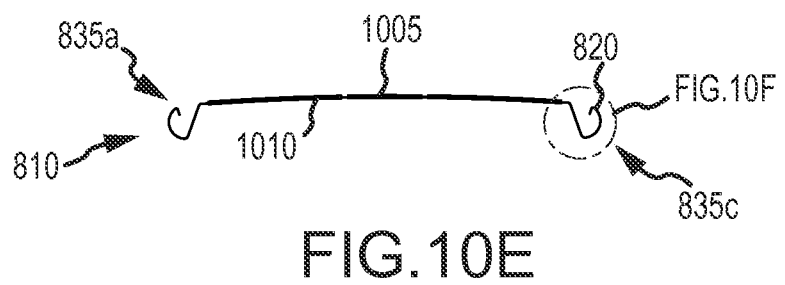
FIG. 10E is a cross-sectional side elevation view of the spring plate shown in FIG. 8.

FIG. 10E is a cross-sectional side elevation view of the spring plate 810. FIG. 10E shows a cross section of the spring plate 810 that corresponds to the reference line 10E shown in FIG. 10A. FIG. 10E shows two springs 820 that are connected to the spring plate 810. The two springs 820 shown in FIG. 10E are those that fall along the reference line 10E shown in FIG. 10A. Specifically, FIG. 10E shows one spring 820 connected to the spring plate 810 on side 835a of the door 210, and another spring 820 connected to the spring plate 810 on side 835c of the door 210.

Figure 10F:
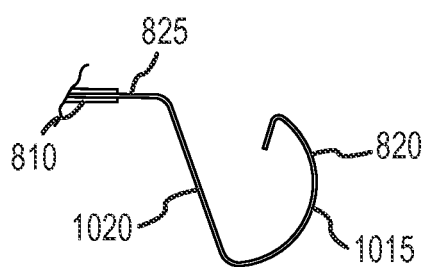
FIG. 10F is a close-up view of an individual spring shown in FIG. 8.

FIG. 10F is a close-up view of an individual spring 820. Specifically, FIG. 10F is a close-up view of the reference circle C shown in FIG. 10C. As shown in FIG. 10F, the spring 820 includes a spring plate connector portion 825. The spring plate connector portion 825 connects to and extends outwardly from the spring plate 810. The spring plate connector portion 825 connects to a spring seat engagement portion 830. The spring seat engagement portion 830 connects to and slopes downward from the spring plate connector portion 825. From an end opposite that of the end connecting to the connector portion 825, the spring seat engagement portion 830 connects to a rear surface engagement portion 835. As shown in FIG. 10F, the rear surface engagement portion curves upwardly to a rounded point at the end of the spring 820.

Figure 11A:
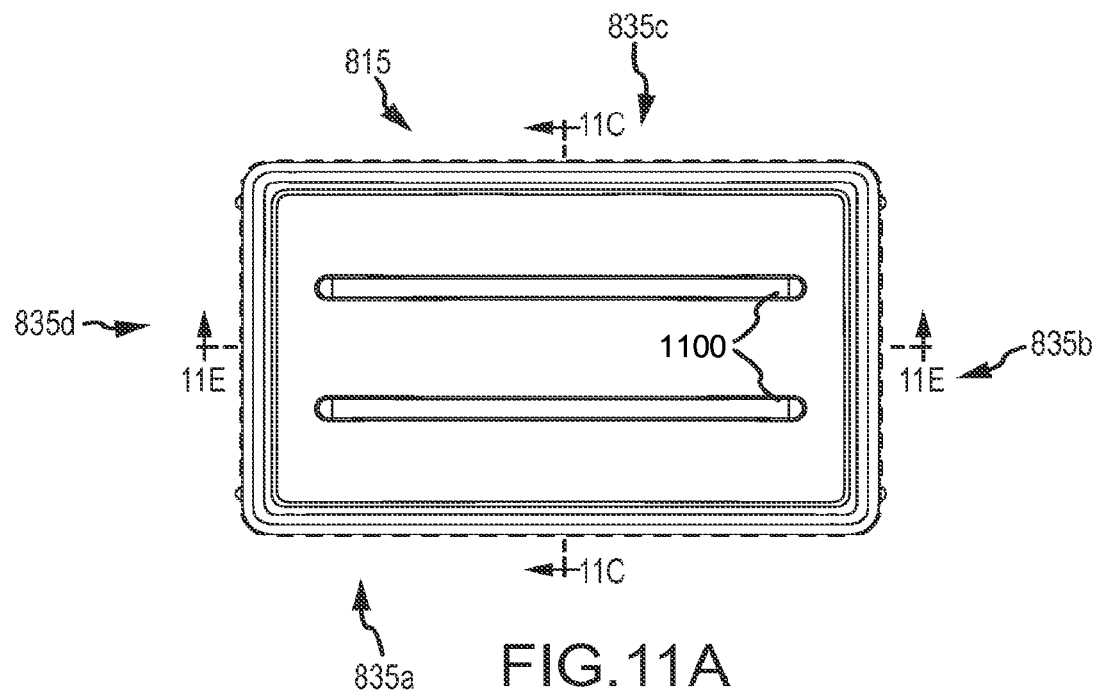
FIG. 11A is a top plan view of the cover shown in FIG. 8.

The cover 815 is shown in greater detail in FIGS. 11A-11E. FIG. 11A is a top plan view of the cover 815. As shown in FIG. 11A, the cover 815 may include a number of recessed slots 1105. In one embodiment, a recessed slot 1100 provides space for which the top portion of a memory stick may sit when the door 210 is connected to the exterior surface 108 of the enclosure wall 105.

Figure 11B:
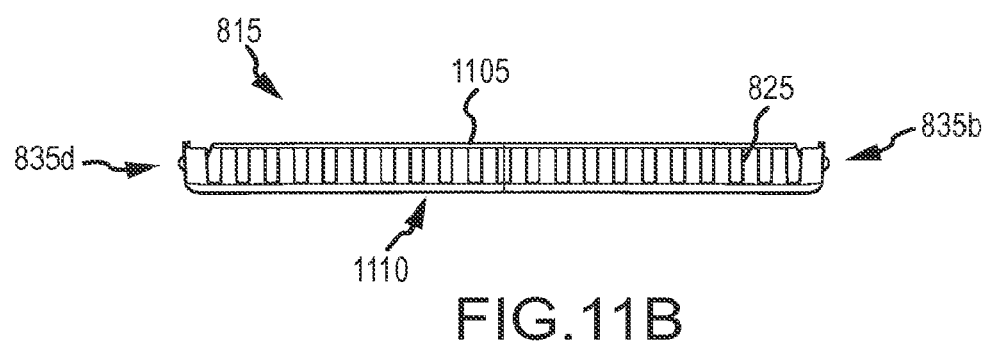
FIG. 11B is a front elevation view of the cover shown in FIG. 8.

FIG. 11B is a front elevation view of the cover 815. FIG. 11B shows a number spring seats 825 that are connected to the cover 815. The spring seats 825 shown in FIG. 11B are those that are attached to the perimeter of the cover 815 along the side 835a of the door 210. As can also be seen in FIG. 11B, the cover 815 includes a first surface 1105 and an second surface 1110. The first surface 1105 of the cover 815 attaches to the second surface 1010 of the spring plate 810 as show in FIG. 8. The second surface 1110 of the cover 815 faces into the interior of the enclosure 100 when the door 210 is attached to the enclosure wall 105.

Figure 11C:
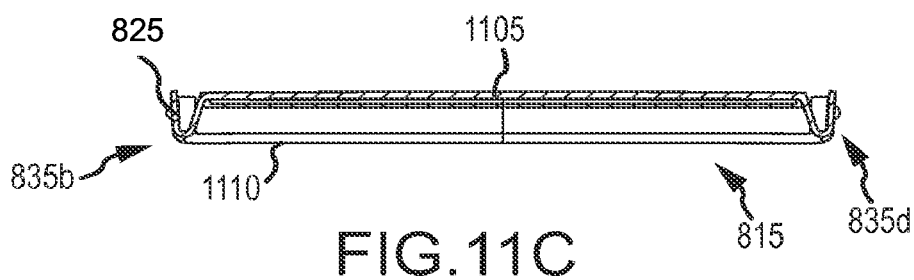
FIG. 11C is a cross-sectional, front elevation view of the cover shown in FIG. 8.

FIG. 11C is a cross-sectional, front elevation view of the cover 815. FIG. 11C shows two spring seats 825 that are connected to the cover 815. The two spring seats 825 shown in FIG. 11C are those that fall along the reference line 110 shown in FIG. 11A. Specifically, FIG. 11C shows one spring seat 825 connected to the cover 815 on side 835b of the door 210, and another spring seat 825 connected to the cover 815 on side 835d of the door 210.

Figure 11D:
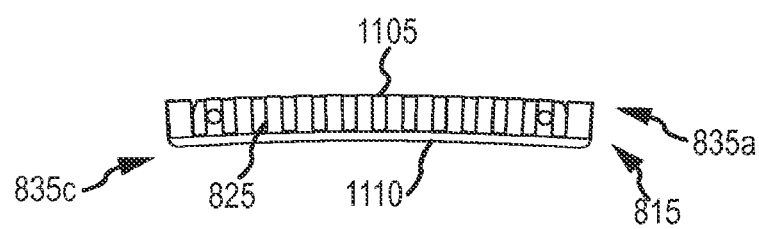
FIG. 11D is a side elevation view of the cover shown in FIG. 8.

FIG. 11D is a side elevation view of the cover 815. FIG. 11D shows a number of Spring seats 825 that are connected to the cover 815. The spring seats 825 shown in FIG. 11D are those that are attached to the perimeter of the cover 815. along the side 835b of the door 210.

Figure 11E:
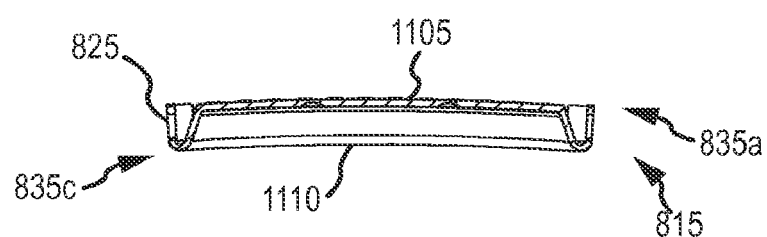
FIG. 11E is a cross-sectional side elevation view of the cover shown in FIG. 8.

FIG. 11E is a cross-sectional side elevation view of the cover 815. FIG. 11E shows two spring seats 825 that are connected to the cover 815. The two spring seats 825 shown in FIG. 11E are those that fall along the reference line 11E shown in FIG. 11A. Specifically, FIG. 11 E shows one spring seat 825 connected to the cover 815 on side 835a of the door 210, and another spring seat 825 connected to the cover 815 on side 835c of the door 210.

Figure 12A:
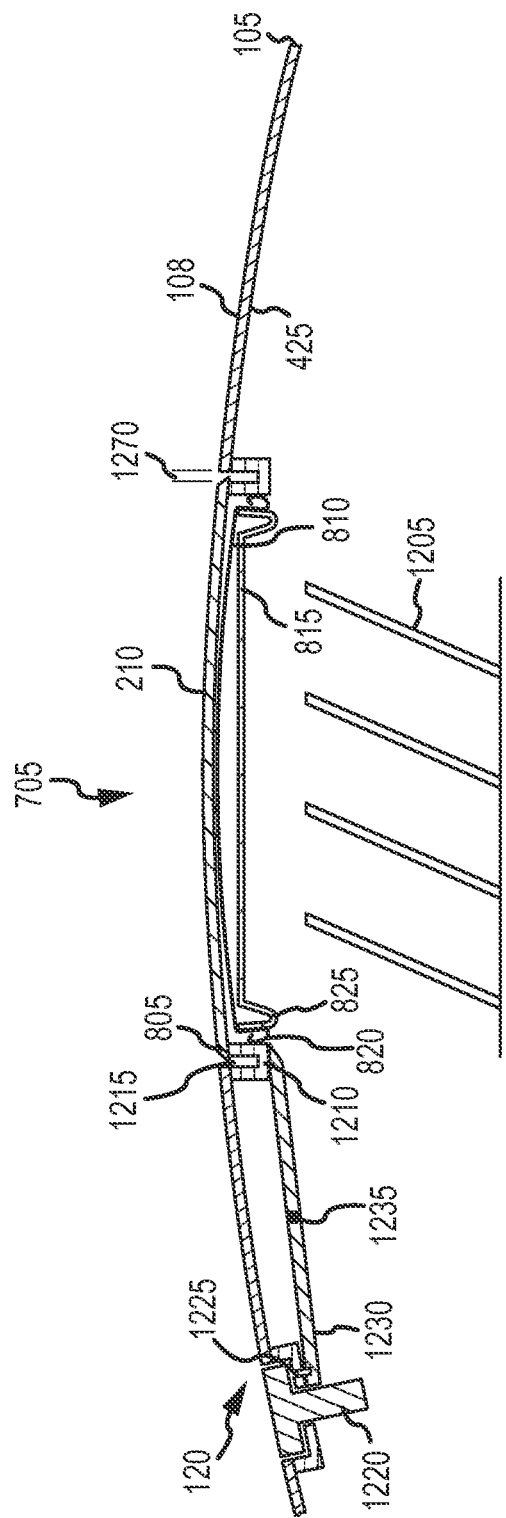
FIG. 12A is a schematic illustration of a cross section of the enclosure wall shown in FIG. 2, with the door attached to the enclosure wall in accordance with embodiments discussed herein.
Figure 12B:
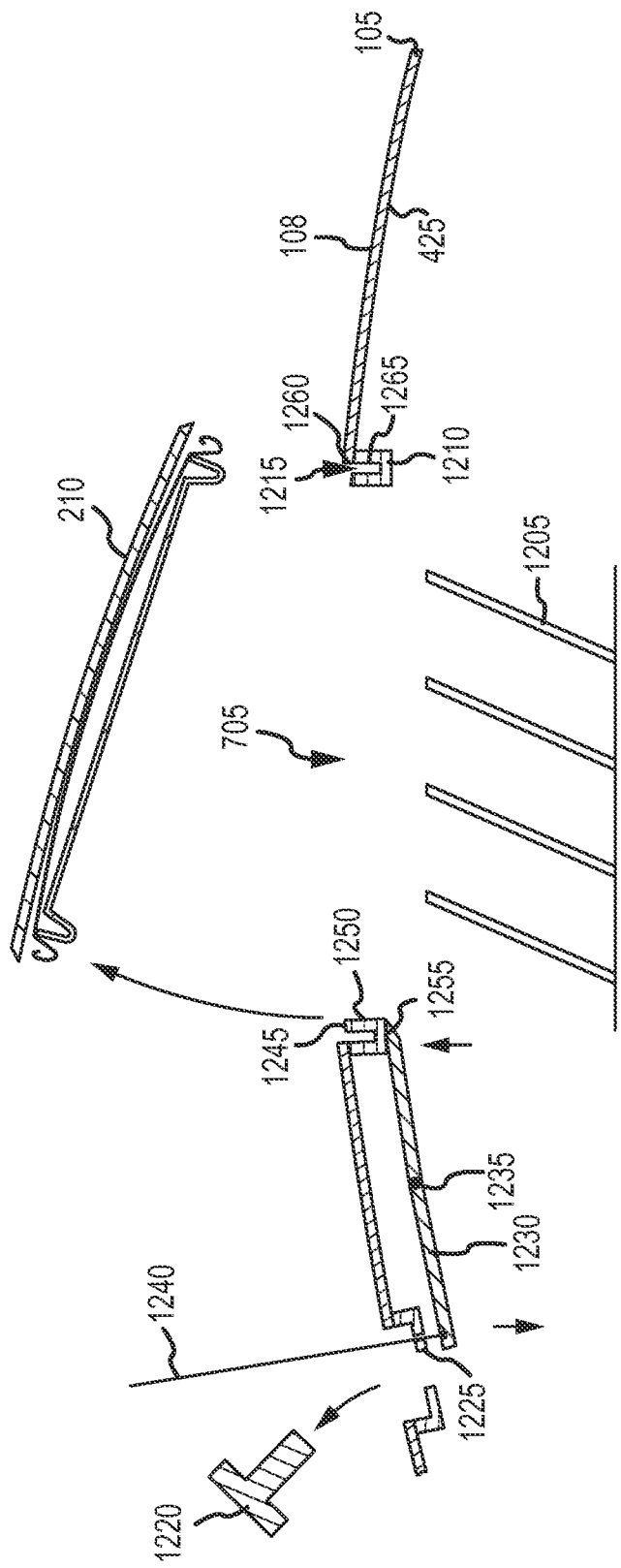
FIG. 12B is a schematic illustration of a cross section of the enclosure wall shown in FIG. 2, with the door detached from the enclosure wall in accordance with embodiments discussed herein.

FIGS. 12A and 12B are schematic illustrations of a cross section of the enclosure wall 105 that includes both the power port 120 and the access opening 705. In FIG. 12A, the removable door 210 is shown as being connected to the enclosure wall 105 such that the access opening 705 is covered. In FIG. 12B, the removable door 210 is shown as being disconnected from the enclosure wall 105 such that the access opening 705 is uncovered. In one embodiment, the door 210 sits in a door seat 1210 when the door 210 is attached to the enclosure wall 105. As shown in FIGS. 12A and 12B, the door seat 1210 may include a protrusion that is connected to an interior surface 425 of the enclosure wall 105 and extends from there into a portion of the memory access opening 705. More specifically, door seat 1210 extends from the interior surface 425 through a plane formed by the wall 1260 of the access opening 705. By attaching to the interior surface 425 the door seat is disposed in a recessed position relative to the exterior surface 108 of the enclosure wall 105.

When the door 210 sits in the door seat 1210, the overhang region 830 of the door cap 805 contacts the door seat 1210. Specifically, an underside of the overhang region 830 of the door cap 805 contacts a first engagement surface 1245 of the door seat 210. In this position, the spring plate 810 and the cover 815 of the door 210 sit laterally adjacent from the spring seat 825. When the door 210 sits in the door seat 1210, the springs 820 compress such that they act against both the door 210 and the enclosure wall 105 to retain the door 210 in place. Specifically, the springs 820 act against the door 210 by pressing against the spring seats 825 that are attached to the cover 815. The springs 820 act against the enclosure wall 105 by pressing against a second engagement surface 1250 that is substantially perpendicular to the first engagement surface of the door seat 1210. The first engagement surface 1245 and the second engagement surface 1250 can be seen in greater detail in FIG. 12B, as here the door 210 is detached from the enclosure wall 105.

The springs 820 impart a force to at least the door seat 1210 in order to retain the door 210 in place. The force imparted by the springs 820 is due to a compression of the springs 820 that occurs when the user inserts the door 210 into place in the door seat 1210. More specifically, referring to FIG. 10F, when the door 210 is connected to the enclosure wall 105, the spring 820 compress such that a door seat engagement portion 1015 of the spring 820 compresses or moves closer to the spring seat engagement portion 1020 of the spring 820. This compression creates the force that is imparted by the door seat 1210, which force retains the removable door 210 in place.

As shown in FIG. 12A, the metal springs 820 are in contact with both the door 210 and the enclosure wall 105. Specifically, the springs 820 are in contact with door 210 because the springs 820 are connected to the spring plate 810 component of the door 210. Additionally, the springs 820 contact the cover 815 component of the door 210 through contact with the spring seats 825. The springs 820 may also contact thee door cap 805 component of the door 210 through contact with the over-hanging region 830. Specifically, when the springs 820 of the spring plate 810 are compressed, a portion of the spring 820 moves to come into contact with the over-hanging region 830 of the door cap 805. The springs 820 are in contact with the enclosure wall 105 through contact with the second engagement surface 1250 of the door seat 1210, as shown in FIG. 12A.

By providing a metal contact that acts against both the enclosure wall 105 and the door 210, the springs 820 provide an electromagnetic compatibility seal for the enclosure wall 105. The springs provide an electromagnetic compatibility seal by forming an electrically conductive path between the enclosure 105 and the spring plate 810. Here, the enclosure 105 and the spring plate 810 together function as Faraday cage or similar structure that substantially inhibits the transmission of electromagnetic radiation into and out of the electronic device enclosure. Specifically, the conductive path between the enclosure 105 and the spring plate 810 interacts with an electrical field that is external to enclosure to cause the electric charges within enclosure wall 105 to redistribute themselves so that the external electric field is cancelled or substantially inhibited within the enclosure. Similarly, the conductive path between the enclosure 105 and the spring plate 810 interacts with an electrical field that is internal to enclosure to cause the electric charges within enclosure wall 105 to redistribute themselves so that the external electric field is cancelled or substantially inhibited within the enclosure.

In one embodiment, the door seat 210 includes a groove 1215 in the first engagement surface 1245 of the door seat 1210. As shown in FIGS. 12A and 12B, the groove 1215 in the first engagement surface 1245 is proximate to the wall 1260 of the access opening 705 such that the wall 1260 of the access opening 705 and a wall 1265 of the groove 1215 form a continuous surface. The groove 1215 in the first engagement surface 1245 can be seen in greater detail in FIG. 12B, as here the door 210 is detached from the enclosure wall 105. The groove 1215 is positioned such that the edge of the door cap 805 does directly contact the first engagement surface 1245 of the door seat 1210 when the door 210 sits in the door seat 1210. More specifically, the groove 1215 offsets the first engagement surface 1245 from the door cap 805 edges such that the door cap 805 edges do not contact the first engagement surface 1245 when the overhang region 830 of the door cap 805 contacts the first engagement surface 1245. This offset provided by the groove 1215 allows the door cap 805 to fit comfortably within the door seat 1210.

In accordance with various embodiments, the groove 1215 may be formed by a two step process. First, a shell for the door seat 1210 is formed using a half-sheer process. Second, the half-sheer shell is machined to create the groove 1215.

In accordance with various embodiments, the access opening 705 is slightly larger than the door cap 805. This difference in sizing creates a spatial gap 1270 between the door cap 805 and the wall 1260 of the access opening 705 when the overhang region 830 of the door cap 805 contacts the first engagement surface 1245 of the door seat 1210. As show in FIG. 9E, the edges of the door cap 805 may be tapered. Due to this tapering, the width of the spatial gap 1270 may vary across a thickness of the door cap 805. As shown in FIG. 12A, the width of the spatial gap 1270 is at its minimum at the interior surface 910 of the door cap 805. Stated another way, the width of the spatial gap 1270 is at its minimum at the interior surface 425 of the enclosure wall 105. Likewise, the width of the spatial gap 1270 is at its maximum at the exterior surface 905 of the door cap 805. Stated another way, the width of the spatial gap 1270 is at its maximum at the exterior surface 108 of the enclosure wall 105.

The spatial gap 1270 allows the door 210 to be more easily connected and disconnected from the enclosure wall 105. At its minimum width, the spatial gap 1270 creates an actual gap between the door cap 805 and the wall 1260 of the access opening 705. This actual gap is sized to allow the door cap 805 to fit as closely as possible to the wall 1260 of the access opening 705 given manufacturing tolerances. At its maximum width, the spatial gap 1270 creates an aesthetic gap between the door cap 805 and the wall 1260 of the access opening 705. The aesthetic gap allows the user to visually locate the edges of the door 210.

Also shown in FIG. 12A is a number of memory sticks 1205. The memory sticks 1205 may be accessed by user when the user removes the door 210 form the enclosure wall 105. It should be appreciated that the removable door 210 as used to provide access for adding memory sticks is described herein by way of example and not limitation. Various embodiments of the door 210 may be implemented in order to provide a removable component that allows access to other components contained within the computing system enclosure 100, such as the power supply, video card, and so on. In one embodiment, the user may remove the door 210 by stripping the door 210 from the enclosure wall 105 through the action of a lever arm 1230. As shown in FIG. 12A, the lever arm 1230 may be attached to the enclosure wall 105 at a pivot point 1235 disposed proximate to the interior surface 425 of the enclosure wall 105.

In various embodiments, the user actuates the lever arm from the exterior of the enclosure 105. In this regard, the enclosure wall 105 may contain a small hole, such as a pin-hole, that extends through the width of the enclosure wall 108. In order to actuate the lever arm 1230, which is located in the interior of the enclosure 100, the user may insert a pin hole tool from the exterior of the enclosure 100 through the pin hole to thereby contact the lever arm 1230. In other embodiments, an end of the lever arm 1230 contains a pin that extends through the pin hole. Here, the actuates the lever arm 1230 by pressing down on a tip of the pin that protrudes through the pin hole to the exterior of the enclosure 100.

In some embodiments, the pin hole is located within a portion of the power port 120. Specifically, as shown in FIGS. 12A and 12B, the lever arm 1230 may extend between the power port 120 and the door seat 1210. The operation of the lever arm 1230 in this embodiment is shown in greater detail in FIG. 12B. As shown in FIG. 12B, the user may remove the door 210 by first removing a power port cap 1220, which may sit in the power port 120. Removing the power port cap 1220 exposes a pinhole 1225, through which the lever arm 1230 may be actuated. Specifically, as shown in FIG. 12B, a user may insert a pinhole tool 1240 through the pinhole 1225, such that the pinhole tool 1240 comes into contact with a first end of the lever arm 1230. By pressing downward with the pinhole tool 1240, the user rotates the lever arm 1230 about the pivot point 1235. The downward motion of the first end of the lever arm 1230 causes an upward motion of the second end of the lever arm 1230, which is in contact with a lever engaging surface 1255 of the door seat 1210. The upward movement of the second end of the lever arm 1220 causes the door 210 to be dislodged from the door seat 1220. Once the door 210 is dislodged from the door seat 1220, the door may then be further removed by a user.

Figure 13A:
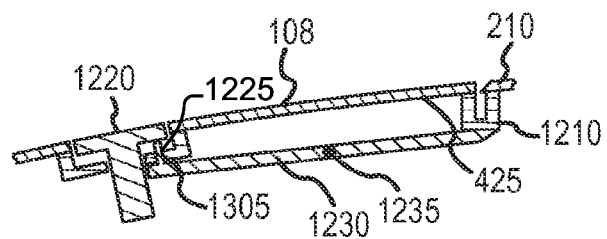
FIG. 13A is a close-up schematic illustration of a cross section of the enclosure wall shown in FIG. 2, with the door attached to the enclosure wall in accordance with another embodiment discussed herein.
Figure 13B:
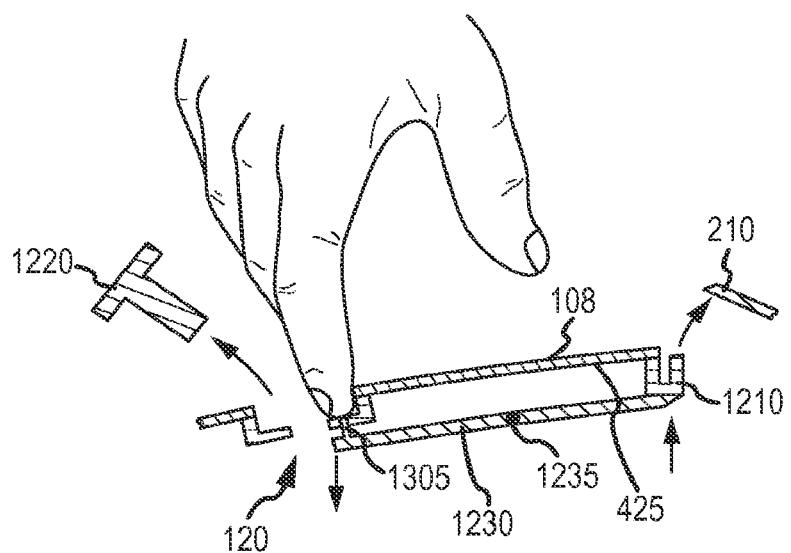
FIG. 13B is a close-up schematic illustration of a cross section of the enclosure wall shown in FIG. 2, with the door detached from the enclosure wall in accordance with another embodiment discussed herein.

It should be appreciated that the pinhole tool mechanism for stripping the door 210 from the exterior surface 108 is described herein by way of example and not limitation. In accordance with other embodiments, the door 210 may be stripped from the exterior surface 108 through a button mechanism, which is illustrated in FIG. 13A and FIG. 13B. FIG. 13A and FIG. 13B are close-up illustrations of a segment of the exterior surface 108 of the enclosure wall 105 that includes both the power port 120 and one end of the door seat 1210. As shown in FIG. 13A, the lever arm 1230 may include a pin 1305 that is attached at to the first end of the lever arm 1230. As shown in FIG. 13A, the pin 1305 protrudes through the pinhole 1225 (see also, FIGS. 12A and 12B). As shown in FIG. 13B, a user may access the pin 1305 by removing the power port cap 1220 and pressing down on the pin 1305 with a fingertip. Pressing down on the pin 1305 with fingertip causes a downward motion of the first end of the lever arm 1230 which rotates the lever arm 1230 about the pivot point 1235. This downward motion and rotation of the lever arm 1230 causes an upward movement of the second end of the lever arm 1230 which presses upward on the door seat 1210. In so doing, the lever arm 1230 causes the door 210 to be dislodged from the door seat 1220. Once the door 210 is dislodged from the door seat 1220, the door may then be further removed by a user.

Figure 14:
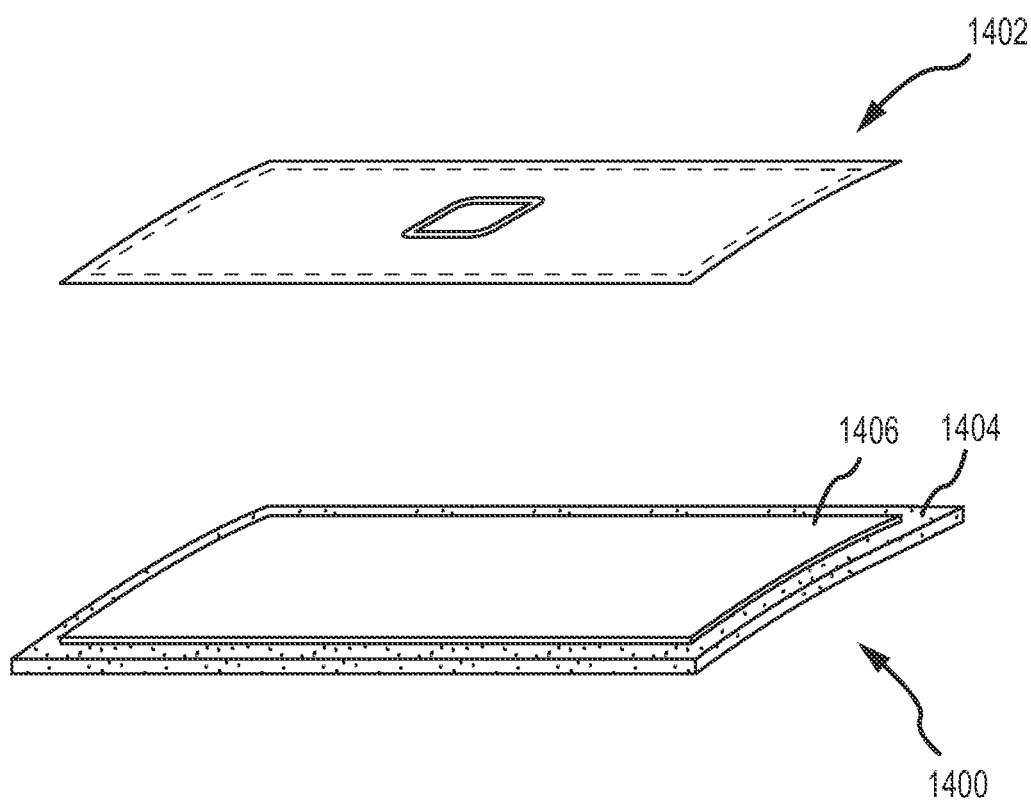
FIG. 14 is an exploded view of an alternative removable door embodiment that includes an electrically conductive compressible gasket.

In accordance with an alternative embodiment shown in FIG. 14, an electrically conductive compressible gasket may used in place of the springs that are described above. FIG. 14 is an exploded view of a door 1400 embodiment that includes a door cap 1402 that is connected to an electrically conductive compressible gasket 1404. The electrically conductive compressible gasket 1404 may be mounted to or otherwise associated with a plate 1406 that provides a mounting for the gasket 1404. In one respect, the gasket 1404 may operate to hold the door 1400 in place within an enclosure opening by exerting a force on the enclosure that is due a compression of the gasket 1404. In another respect, the gasket may provide an electromagnetic compatibility seal by forming an electrically conductive path between the enclosure and the door 1404, door cap 1402, and and/or the plate 1406 such that transmission of electromagnetic radiation into and out of the electronic device enclosure is substantially inhibited.

CONCLUSION

Although embodiments have been fully described with reference to the accompanying drawings, it is to be noted that various changes and modifications will become apparent to those skilled in the art. Such changes and modifications are to be understood as being included within the scope of the various embodiments as defined by the appended claims. The foregoing description has broad application. Accordingly, the discussion of any embodiment is meant only to be an example and is not intended to suggest that the scope of the disclosure, including the claims, is limited to these examples.

What is claimed is:

1. An electronic device, comprising:
an enclosure defining an access opening; and
a removable door comprising:
a spring plate;
a group of springs integrally formed with, and extending away from, a perimeter of the spring plate;
a door cap coupled to the spring plate and configured to cover the access opening formed in the enclosure, the door cap including an exterior surface forming a portion of an exterior surface of the enclosure; and
a cover coupled to the spring plate opposite to the door cap and defining a group of spring seats, each spring seat of the group of spring seats configured to receive a corresponding spring of the group of springs;
wherein for each spring of the group of springs:
a first portion of the spring extends from the spring plate along a direction away from the door cap;
a second portion of the spring extends from the first portion, along a curve and toward the spring plate, and contacts the enclosure such that the first and second portions are positioned between the spring plate and the enclosure, the second portion defining a free end of the spring; and
the first and second portions configured to retain the door cap within the access opening when the door cap covers the access opening.

2. The removable door of claim 1, wherein the door cap further comprises an overhang region located between a perimeter of the door cap and the perimeter of the spring plate.

3. The removable door of claim 2, wherein the overhang region of the door cap contacts a first engagement surface of a door seat connected to the enclosure, the door seat located within the access opening and recessed from the exterior surface of the enclosure.

4. The removable door of claim 3, wherein the door seat further comprises a groove formed in the first engagement surface, proximate to a wall of the access opening, the wall of the access opening and a wall of the groove form a continuous surface.

5. The removable door of claim 4, wherein the perimeter of the door cap comprises a group of door cap edges positioned adjacent at least one of the groove and the first engagement surface of the door seat contacted by the overhang region of the door cap.

6. The removable door of claim 5, wherein the door cap edges of the door cap are tapered to vary a spatial gap between the door cap and the wall of the access opening over a thickness of the door cap.

7. The removable door of claim 6, wherein the spatial gap is smaller between an interior surface of the door cap and the wall of the access opening than the spatial gap between the exterior surface of the door cap and the wall of the access opening.

8. The removable door of claim 3, wherein the group of springs compress against a second engagement surface of the door seat positioned substantially perpendicular to the first engagement surface of the door seat.

9. The removable door of claim 1, wherein the group of springs provide an electromagnetic compatibility seal such that transmission of electromagnetic radiation into and out of the electronic device enclosure is substantially inhibited.

10. An electronic device enclosure comprising:
an enclosure wall comprising an exterior surface and an interior surface;
an opening formed in the enclosure wall to provide access to an interior space, the opening covered by a removable door;
a door seat connected to the enclosure wall and located within the opening in a recessed position relative to the exterior surface of the enclosure wall; and
wherein the removable door comprises:
a spring plate including a group of springs extending away from a perimeter of the spring plate and configured to retain the removable door within the opening when the removable door covers the opening; and
a cover coupled to the spring plate facing the interior space of the enclosure and defining a group of spring seats, each spring seat of the group of spring seats configured to receive a corresponding spring of the group of springs; and
wherein for each spring of the group of springs:
a first segment of the spring extends angularly from a top surface of the spring plate and toward the interior space;
a second segment of the spring curves from the first segment toward the top surface of the spring plate and engages the door seat, the second segment defining a free end of the spring; and
the first and second segments interposed between the door seat and the spring plate.

11. The enclosure of claim 10, wherein the door seat comprises:
a first door engagement surface contacting a portion of the removable door covering the opening;
a groove formed through the first door engagement surface and proximate to a wall of the opening;
a groove wall formed adjacent the groove, the groove wall and the wall of the opening forming a continuous surface; and
a second door engagement surface positioned substantially perpendicular to the first door engagement surface.

12. The enclosure of claim 11, wherein the door seat further comprises a lever engaging surface positioned adjacent the second door engagement surface.

13. The enclosure of claim 12 further comprising a lever arm pivotably mounted to the interior surface of enclosure wall, the lever arm comprising:
a first end contacting the lever engaging surface of the door seat; and
a second end positioned adjacent the first end.

14. The enclosure of claim 13 further comprising a pin hole extending through the enclosure wall; wherein
the second end of the lever arm is aligned with the pin hole.

15. The enclosure of claim 14 further comprising a pin mounted on the second end of the lever arm, the pin disposed through the pin hole such that an end of the pin extends to the exterior of the enclosure.

16. The enclosure of claim 15 further comprising a power port disposed on the enclosure wall; wherein the pin hole extending through the enclosure wall is located within the power port.

17. The enclosure of claim 16, further comprising a power port cap removably coupled to the power port to cover the pin hole.

18. An electronic device comprising:
an enclosure comprising:
an enclosure wall;
an opening formed in the enclosure wall to provide access to an interior space; and
a door seat connected to the enclosure wall and positioned within the opening; and
a removable door covering the opening of the enclosure, the removable door comprising:
a spring plate having opposing top and bottom surfaces;
a group of springs extending away from a perimeter of the spring plate;
a door cap contacting the door seat and covering the opening formed in the enclosure, the door cap comprising an interior surface coupled to the spring plate; and
a cover coupled to the spring plate, the cover facing the interior space and separated from the door cap by the spring plate, the cover defining a group of spring seats configured to receive the group of springs, respectively;
wherein, for each spring of the group of springs:
a first section extends from the perimeter of the spring plate and along a direction away from the door cap;
a second section forms a curve extending from the first section and toward the top surface, the second section contacting the door seat along the curve and defining a free end of the spring; and
the first and second sections are configured to retain the door cap within the opening when the door cap covers the opening; and
wherein the first and second sections of the spring are positioned between the spring plate and the door seat.

19. The electronic device of claim 18, wherein the enclosure further comprises a lever arm pivotably mounted to the enclosure wall, the lever arm comprising:
a first end contacting the door seat; and
a second end positioned adjacent the first end; wherein in response to actuation, the lever arm dislodges the group of springs of the removable door.

* * * * *